United States Patent [19]

Gergis

[11] 4,079,359

[45] Mar. 14, 1978

[54] COMPACT TRANSFER REPLICATE SWITCH FOR MAGNETIC SINGLE WALL DOMAIN PROPAGATION CIRCUITS AND METHOD OF MAKING SAME

[75] Inventor: Isoris S. Gergis, Placentia, Calif.

[73] Assignee: Rockwell International Corporation, El Segundo, Calif.

[21] Appl. No.: 628,293

[22] Filed: Nov. 3, 1975

[51] Int. Cl.² .................... G11C 19/08; B32B 31/00
[52] U.S. Cl. ................................. 365/43; 156/659; 427/128; 365/12
[58] Field of Search ............... 340/174 TF; 156/659; 29/604; 427/128, 130

[56] References Cited

U.S. PATENT DOCUMENTS

| | | | |
|---|---|---|---|
| 3,680,067 | 7/1972 | Chow | 340/174 TF |
| 3,832,701 | 8/1974 | Bobeck et al. | 340/174 TF |
| 3,967,002 | 6/1976 | Almasi et al. | 340/174 TF |

OTHER PUBLICATIONS

IEEE Transactions on Magnetics, vol. Mag. 9, No. 3, Sep. 1973, pp. 474–480.

*Primary Examiner*—James W. Moffitt
*Attorney, Agent, or Firm*—H. Fredrick Hamann; G. Donald Weber, Jr.

[57] ABSTRACT

A single-level process in which a precision registration process step is replaced by a gross alignment process step in delineation of magnetic and non-magnetic levels in magnetic bubble domain devices. In the instant process, one fine definition and two gross definition process steps are used to define the propagation structure and the fine control conductors simultaneously. This process permits certain fabrication advantages and improved device operation.

A compact transfer/replicate switch is fabricated by the new process. This switch permits the transfer of magnetic bubbles between more compactly arranged propagation paths, such as storage tracks and access tracks, in magnetic bubble domain devices and systems.

10 Claims, 5 Drawing Figures

COMPACT TRANSFER REPLICATE SWITCH FOR MAGNETIC SINGLE WALL DOMAIN PROPAGATION CIRCUITS AND METHOD OF MAKING SAME

BACKGROUND OF THE INVENTION

1. Field of the Invention

This invention relates to a process for making field accessed bubble domain devices and to a device which permits manipulation, e.g. transfer or replication, of magnetic bubble domains between different propagation paths in typical magnetic bubble domain chip organization.

2. Description of Prior Art

In fabricating bubble domain devices, many processes are known. Frequently used processes are the so-called "two-level" or "one-level" processes. It is desirable to use as few "levels" of processing as possible in order to reduce fabrication complexity and to improve yields. Thus, the one-level process is frequently used in order to produce devices in which the permalloy overlay circuit serves as both the source of the bubble drive field and as a conductor of control currents for functions such as generation, annihilation, switching and the like. However, such devices suffer from certain drawbacks. For example, permalloy has a high resistivity (relative to the conductor material) wherein narrow control conductors can cause overheating and device burnout. Also, return current leads frequently interfere with bubble domain propagation in other components. Moreover, non-magnetic return current leads are sometimes necessary (or desirable) for proper operation of devices or systems. Consequently, a one-level process which overcomes these problems, and devices fabricated by such a process are desirable.

Devices or systems that utilize magnetic bubbles for storage of data in a binary form typically use soft magnetic overlay structures for propagation and storage of bubbles. These structures are usually arranged in arrays of T-I, X-T or chevron patterns. Transferring and replication (by stretching and separation of bubbles) between different tracks is accomplished by selectively interconnecting these tracks. Current carrying conductors are used to effect the transfer or the replicate functions in non-passive switches. Examples of these gates or switches are the so-called dollar sign transfer gate and the chevron-chevron transfer-replicate switch.

The dollar sign transfer gate disclosed in U.S. Pat. No. 3,714,639 to Kish et al., selectively diverts bubbles from T-I storage tracks and T-I access tracks when a current pulse is applied to the conductor. The dollar sign transfer gate is fabricated using a two step process in which the conductor level must be processed before the permalloy layer. These layers must be aligned to each other with a high degree of accuracy.

The chevron-chevron transfer replicate switch as described by T. J. Nelson, AIP Conference Proceedings, No. 18, Part 1, pp. 95-99 (1974) is used to transfer bubbles from one chevron path to another, such as between major and minor loops. This switch can be fabricated using a single level definition. One fine-definition process is needed to define both the permalloy and the conductor patterns. Chevron tracks, however, are not as compact as the T-I or T-X tracks such that fewer bubbles are stored for the same device surface area. Consequently, the device described by Nelson requires extensive chip geometry utilization and relatively high time requirements for data (bubble domain) throughput.

SUMMARY OF THE INVENTION

This invention relates to a process for making bubble domain devices such as a transfer/replicate switch device fabricated from soft magnetic material such as permalloy which is used in the manipulation of magnetic single wall domains (bubbles) between propagation tracks or paths in bubble domain devices or systems. The switch device is of the chevron-chevron type which includes a current conductor formed with portions (e.g. chevron columns) of separate propagation paths and properly aligned structures for controlling the propagation of bubble domains in a minimum chip area.

BRIEF DESCRIPTION OF DRAWING

Referring now to FIG. 1, there is shown a cross-section of a portion of a composite fabricated in accordance with the instant invention. Initially, a suitable substrate 10 is provided. In a preferred embodiment, this substrate may be of the so-called gadolinium gallium garnet ($G^3$) type of material. A film or layer 11 of magnetic material is provided on a surface of substrate 10. Film or layer 11 may typically be a magnetic garnet film. However, any suitable material for supporting magnetic bubble domains is contemplated. Typical compositions for substrate 10 and layer 11 are well known in the art.

A layer 12 of a suitable electrically insulating material such as silicon dioxide is formed on the surface of magnetic film 11. A layer 13 of conductive material such as but not limited to aluminum, copper alloy is formed on the surface of the dielectric 12.

It should be noted that any suitable process for forming the various layers is contemplated. That is, a chemical vapor deposition (CVD) process may be used, sputtering may be used or a liquid phase epitaxy (LPE) technique may be used. The particular process to be utilized is a function of the materials and the composite to be formed thereby and is not limitative of the invention.

Once the various processes have been decided upon and the appropriate composite produced, as described above, a basis for a magnetic bubble domain device, such as a memory or other system, is provided.

Figure 1:
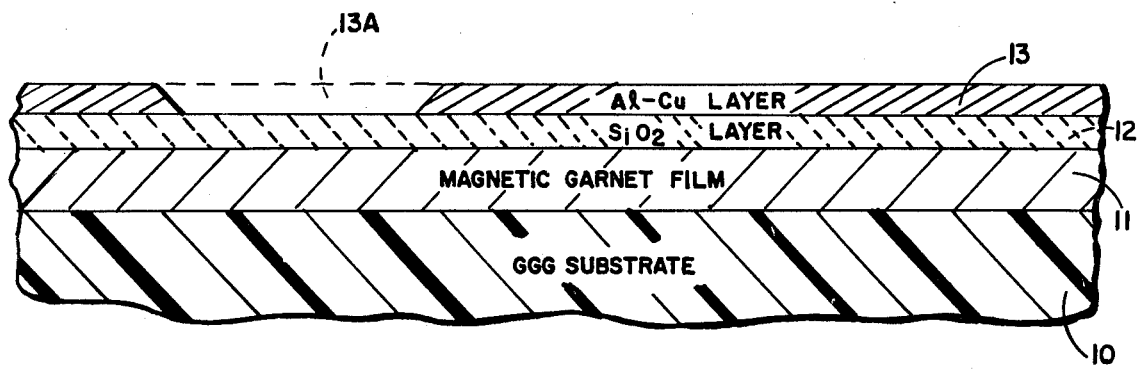
FIG. 1 is a cross sectional view of a portion of a composite fabricated in accordance with the invention.

Initially, a suitable mask (not shown) is placed on the surface of the conductive layer 13 of the composite shown in FIG. 1. Any suitable type of mask such as a photoresist or the like may be utilized. Once the mask has been appropriately applied and formed, a suitable etching process such as a chemical etching, ion milling or the like, is performed. This masking and etching process is the relatively gross alignment process which is used in areas where fine line definition is not required. The etching process permits the removal of relatively large areas of the conductive layer at the surface of the composite. Thus, relatively large portions such as portion 13A (indicated by dashed outline) of layer 13 can be removed. Typically, these relatively gross alignment areas are established in those areas where careful alignment of structures is not required. For example, in those areas where a detector structure is to be inserted, a relatively large conductor may be used which does not require critical alignment of the structure.

Figure 2:
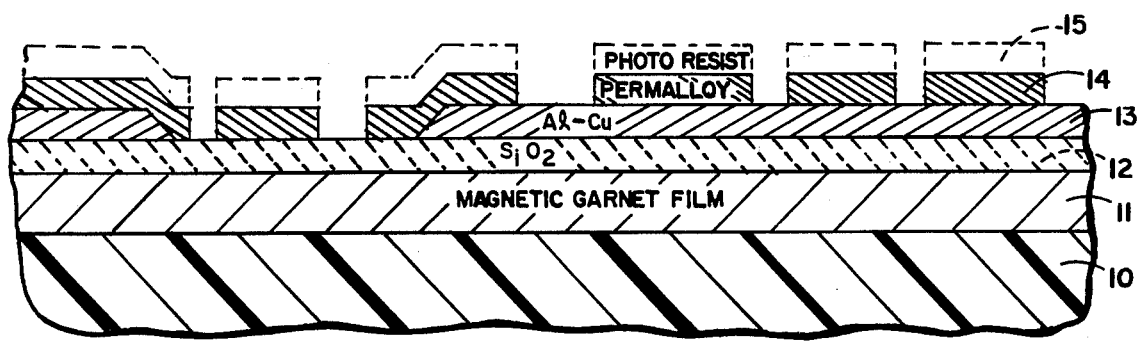
FIGS. 2 and 3 are cross sectional views of the composite shown in FIG. 1 after further operations.

Referring now to FIG. 2, the composite shown in FIG. 1 is now provided with a layer 14 of a suitable magnetizable material such as, but not limited to, permalloy. The permalloy layer is deposited in a preferred manner over the surface of layer 13 of the composite. An additional masking layer 15 such as photoresist or the like is then deposited over the surface of magnetizable layer 14. Mask 15 is defined in a suitable manner such as by exposure and development wherein the preferred pattern in the magnetizable area 14 is defined. The appropriate etching process is performed on the composite wherein the unmasked portions of layer 14 are removed as shown in FIG. 2. It should be noted that mask 15 provides a fine-line definition of the pattern desired in layer 14. This operation is performed to define the propagation pattern and the fine-line control conductor. It must be understood that regardless of the etching process (whether chemical etch, ion milling or the like) this step should be closely controlled to avoid the removal of any appreciable amount of conductor layer 13. That is, only the permalloy pattern should be effected at this point.

A further gross mask (not shown) is aplied to the entire surface of the composite shown in FIG. 2 including the photoresist masks which are left on the unetched permalloy. This second gross mask is, typically, used to define the return current leads. When the second gross mask has been appropriately provided and developed in a suitable manner, the etching of conductor layer 13 can be performed using ion milling, a chemical etchant or the like. The type of etching is, to some extent, dependent upon the material of the conductor and the types of masking material or vice versa.

Figure 3:
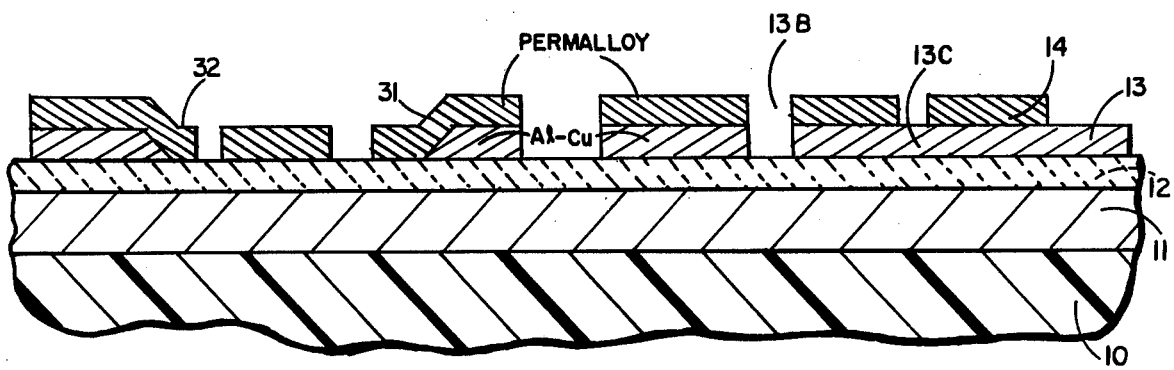

Reference is made to FIG. 3 which shows the cross-sectional view of the device after the second gross masking and etching operation is completed. In addition, the photoresists (and other masking materials) have been removed. In addition, portions 13B and the like are removed from conductor layer 13. Of course, other portions 13C (and the like) are not removed inasmuch as they were masked by the second gross mask. This permits individual control conductors to be provided for the system.

Of course, it should be understood that it may be desirable in some instances to use a second fine-line definition process for defining and producing the control conductors. This second fine-line definition process may be used in addition to the fine-line definition process used in establishing the propagation structure. The second process has the advantage of establishing the permalloy or magnetizable layer 13 in a strictly planar form wherein no step coverage by the conductor layer is required. For example, the step portions 31 and 32 of layer 14 can be eliminated by the second fine-line definition process. Avoiding step coverage avoids the difficulty of establishing permalloy patterns or elements over the edges of the conductor inasmuch as the conductor layer extends everywhere except in the detector area.

Figure 4:
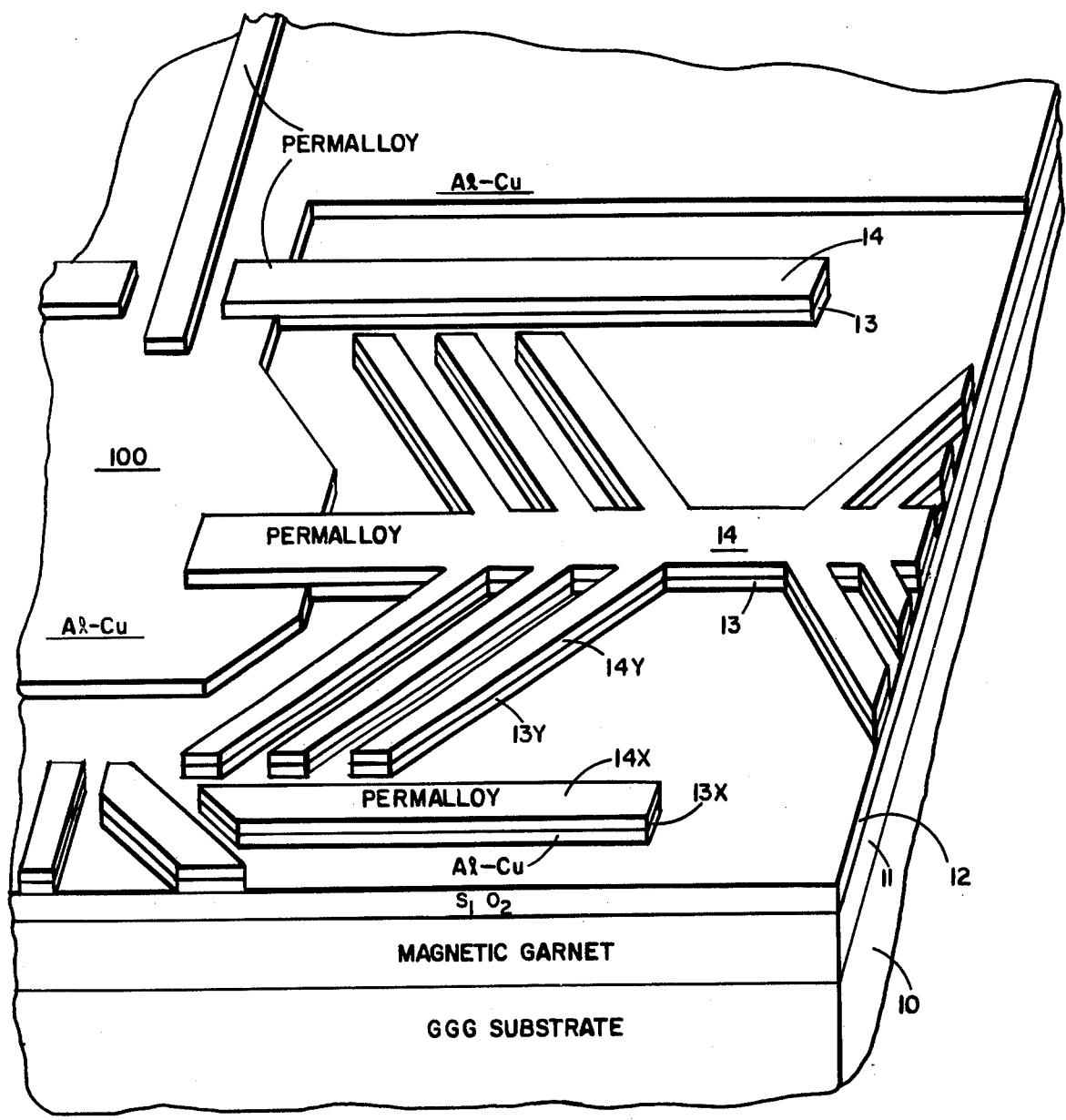
FIG. 4 is a perspctive of a device fabricated in accordance with the invention.

Referring now to FIG. 4, there is shown a portion of a transfer/replicate switch fabricated in accordance with the process described supra. Thus, the layer portions 14 represent the portions of the magnetizable layer which are retained during the fine-line process. The conductor portions 13 immediately beneath the magnetizable layers 14 are also defined during the fine line definition. However, it can be seen that portion 100 of layer 13 is a portion of a return current lead which has little or no requirement for careful definition. Consequently, portion 100 of layer 13 is determined by utilization of the second gross masking process.

As is seen, conductor portion 100 of layer 13 is relatively large compared to the conductor portion 13 under the associated portions of magnetizable layer 14. Because of the relative sizes, the alignment of conductor portion 100 is not critical relative to the permalloy portions or magnetizable layer 14. In other words, if conductor portion 100 were to be out of alignment by half a line width (or perhaps more), an interconnection between conductor portion 100 and conductor portion 13 is still effected readily. However, if a fine-line masking arrangement were utilized to define the control conductor 14, it is possible that a misalignment of half a line width would be extremely detrimental and, perhaps, catastrophic to the operation of the device.

Figure 5:
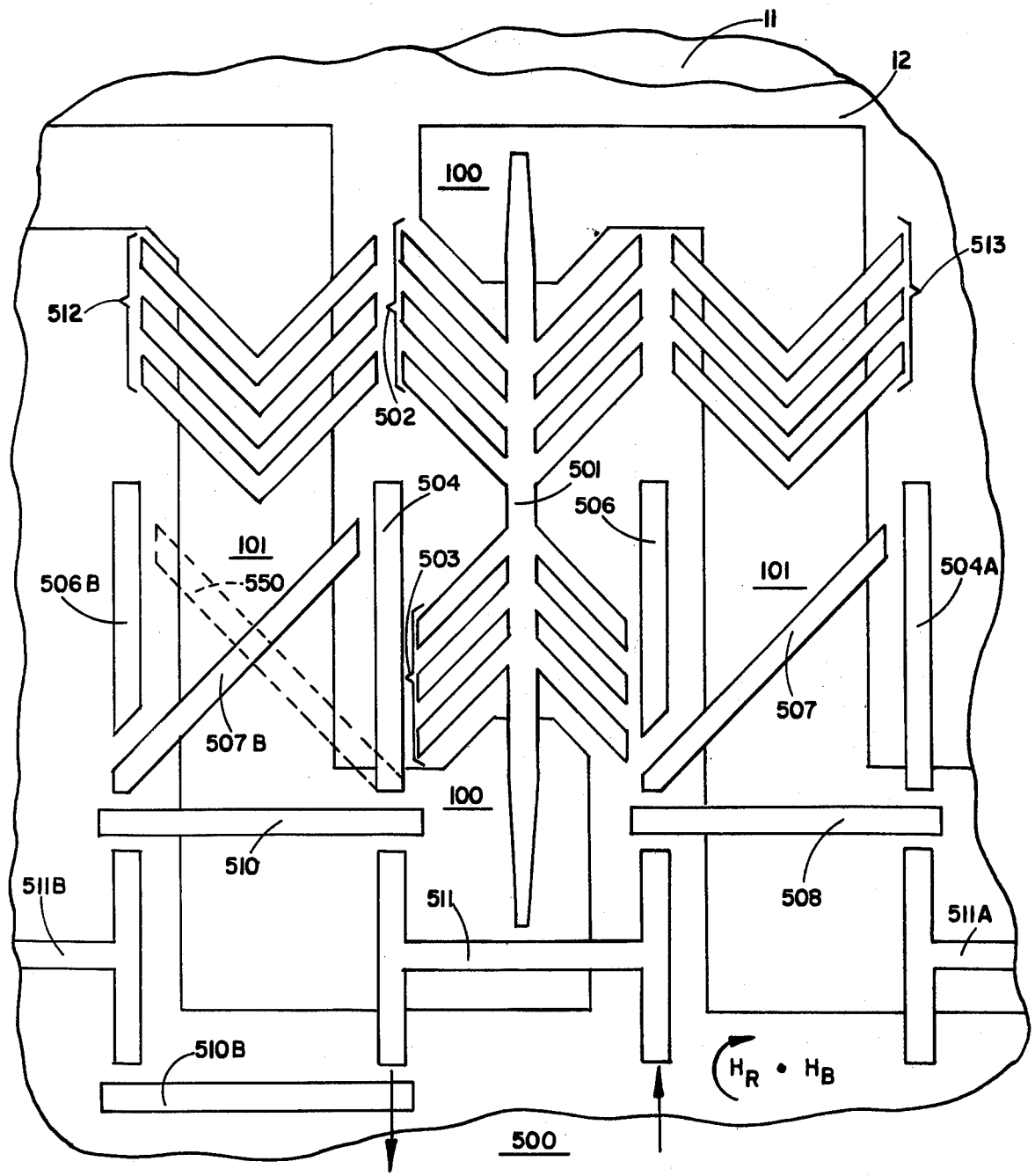
FIG. 5 is a plan view of a device fabricated in accordance with the instant invention.

Referring now to FIG. 5, there is shown one embodiment of a transfer/replicate switch fabricated in accordance with the method described above. Again, magnetizable layer 11 is covered by a dielectric layer 12. The conductive layer 13 (FIGS. 1-4) is etched wherein conductor portions 100 and 101 are defined by the gross definition process and the other elements of magnetizable layer 14 (see FIGS. 1-4) and the attendant conductor layer are defined by the fine-line definition process.

The transfer/replicate switch 500 comprises primarily a pair of opposite chevron columns 502 and 503. In the embodiment described, the chevron columns include three chevrons each. However, the number of chevrons is not limitative of the invention.

Chevron columns 502 and 503 are oppositely directed. That is, the apices of the chevrons of the columns point toward each other wherein columns 502 and 503 are essentially anti-parallel. The apices of each of the chevrons in columns 502 and 503 are connected together by magnetizable layer strip 501. Typically, the chevrons and strip 501 may be fabricated of permalloy or the like. It must be understood that a conductor portion extends under strip 501 and interconnects with conductor portions 100 (see FIG. 4).

In addition, elements 506, 507 and 508 as well as elements 504, and 510 are included in the transfer/replicate switch. Each of the aforementioned elements are in the form of an I-bar element. These bars are arranged as a transition type array. In particular, elements 504 and 506 are essentially parallel to each other and parallel to the ends of chevron column 503. Elements 508 and 510 are arranged substantially perpendicular to elements 506 and 504, respectively. In addition, element 507 is arranged at an angle to each of elements 508 and 506. One end of element 507 is interjected between the adjacent ends of elements 506 and 508. It should be noted that adjacent ends of elements 506, 507 and 508 are aligned in a virtually linear arrangement which is substantially co-linear with element 506. Likewise, the adjacent end of element 510 is located substantially co-linearly with element 504. In addition, the co-linear arrangements of elements 506, 507 and 508 are aligned with one bar portion of element 511 which is an H-shaped element. The other side of H-shaped element 511 is substantially co-linear with the adjacent ends of elements 504 and 510. As noted, element 511 is one element of a propagation path wherein bubbles enter and exit switch 500 in accordance with the arrows shown adjacent to element 511.

Elements 506B, 507B and 511B are counterparts to elements 506, 507 and 511, respectively. These counterparts are contained in additional switches, propagation paths or the like which are similar to the element 511 shown and described. Likewise, elements 504A and 511A correspond to elements 504 and 511, respectively, in additional device structures.

Chevron columns 512 and 513 are additional columns of chevrons which are disposed adjacent to chevron column 502. Columns 512 and 513 may represent additional columns of chevrons which form a portion of a propagation path, a detector or the like.

In operation, it should be considered that suitable propagation paths comprising T-bars, I-bars and/or H-bars (or combinations thereof) are formed in appropriate fashion such as storage loops or the like. These loops include elements 511, 511A and 511B respectively. It is conceivable that each of these elements may be portions of a single propagation path. However, it is also conceivable that each of these elements may represent a portion of an individual circuit path or loop. For example, a plurality of "minor loops" may respectively include one of these elements.

Regardless of the arrangements of the various minor loops, the description relates only to the individual transfer/replicate switch 500 as shown in FIG. 5. Thus, bubble domains may be propagated through the propagation path and enter the switch as suggested by the arrow at the lower right portion of the switch. The bubbles propagate under the influence of the fields $H_B$ and $H_R$ in a well known fashion.

As the field $H_R$ rotates in a counterclockwise direction, a bubble domain is transferred from element 511 to the left end of element 508. The bubble then continues to be transferred to the respective ends of elements 507 and 506 at which magnetic poles are formed by the rotating field. The bubble, in response to field $H_R$, is then transferred to the right ends of the chevrons in columns 503 where the bubble domain is stretched along the chevron column as is known in the art.

In the normal operation of the device, a bubble moves from the right ends of chevrons of column 503 to the apices thereof through to the left ends of these chevrons until it is transferred to the end of element 504. From element 504 the bubble domain is transferred to element 510 and then to element 511 and element 510B of the propagation path as suggested by the arrow.

In the replicate-out mode of operation (i.e. a bubble in the propagation path is replicated into the access path), a bubble is transferred through elements 511, 508, 507 and 506 as noted supra. In addition, the bubble is transferred to the right ends of the chevrons of column 503 in the usual manner. Thus, the bubble is stretched along the length of the chevron column 503. In response to the field $H_R$, the stretched bubble tends to move toward and slightly beyond the apices of the chevrons of column 503. When the bubble is just past the apices of the chevrons in column 503, a current is supplied to conductor 100 which current also passes through the conductor under element 501. This current is of sufficient intensity and proper polarity to produce a magnetic field which is effective to stretch the bubble across the space between chevron columns 502 and 503. Thus, an elongated bubble domain is essentially stretched across columns 502 and 503 slightly to the left of the apices and element 501. The current is not of sufficient intensity, polarity or duration to block the movement of the bubble domain nor to overcome the effect of the rotating field. However, the stretched bubble is retained briefly on the output side of element 501 due to the field produced by the current in the conductor therebeneath. As the field continues to rotate the opposite ends of the bubble tend to move in opposite directions along the chevrons in columns 502 and 503. In particular, the lower portion of the bubble tends to move toward the left end of chevrons in column 503 while the upper bubble portion remains adjacent the apices of the chevrons in column 502. As the bubble stretches between the chevron columns and across element 501, a current pulse of opposite polarity (relative to the stretch current) and of appropriate intensity is applied via conductors 100 to the conductor under element 501. This current produces a magnetic field of appropriate intensity and polarity adjacent element 501 to cause the bubble to be severed into two separate bubbles at the respective chevron columns 502 and 503. The one bubble then continues, as described supra, through the propagation path as determined by elements 504, 510, 511 and so forth. The other bubble, under the influence of rotating field $H_R$ propagates toward the right ends of the chevrons in column 502 and, thence, to the chevrons in column 513 and so forth.

Thus, a bubble in the propagation path suggested by H-bar 511 traverses switch 500 and is returned to the bubble path or storage loop. In addition, the bubble is replicated into the access path of the upper chevrons where it may be supplied to a detector, a major loop or the like. It is important to note that the bubble propagation and replication has taken place within one period of the rotating field $H_R$ as well as within one element space of the magnetic bubble domain system. This operation permits substantial packing density of devices and, thus, information, as well as high throughput of information.

In the replicate-in mode informaion is transferred from the access path represented by the chevron columns at the upper portion of the figure (e.g. chevron columns 512 and 513) into the storage loop (e.g. represented by element 511). Initially, a bubble is propagated along the access path under the influence of rotating field $H_R$ in the usual manner. Thus, a bubble is propagated from the chevron column 512 into chevron column 502 in a typical fashion. As the field continues to rotate, the bubble propagates toward and slightly beyond, i.e. on the output side of, the apices of the chevrons in column 502. At that time, a current is supplied via conductors 100 to the conductor under element 501. This current is of proper polarity and sufficient intensity to effectively retain the bubble adjacent the apices of the chevrons of column 502. Moreover, the applied current provides a magnetic field which causes the bubble to stretch to the apices of the chevrons in column 503 wherein the bubble encompasses both chevron columns. The current is removed when the bubble has stretched between the right ends of chevron column 502 and the left end of column 503 in response to the rotating field $H_R$. The bubble stretches across element 501. A cutting current pulse is applied via the conductor under element 501 wherein two separate bubbles propagate through the respective paths as discussed supra.

In the transfer modes of operation (transfer-in or transfer-out) operation of the circuit is substantially similar to that described above. However, in the transfer modes the bubble is transferred from one propagation path to the other without continuing along the original path. Thus, there is no replication of bubbles.

In the transfer-in mode, a bubble propagates through the propagation path, for example, from element 511 to elements 508, 507 and 506 to the right end of chevron 503, respectively. As the bubble is propagated toward the apices of the chevrons of column 503, a current is supplied via conductors 100 to the conductor beneath element 501. This current is of the proper polarity and sufficient intensity to effectively block the passage of the bubble when it reaches element 501. The current is maintained until the rotating field $H_R$ is substantially reversed wherein the magnetization of the column 502 is magnetically attractive. It should be noted that element 501 and the magnetic field produced by the conductor under element 501 prevents the bubble in the chevron 503 from being annihilated even as the chevron column 503 becomes magnetically repulsive in response to field $H_R$.

When chevron column 502 is magnetically attractive, the bubble on column 503 is attracted to column 502. When the bubble is attracted to column 502, the rotating field $H_R$ continues to operate and to propagate this bubble through the access path in a normal fashion. It is noted that the field supplied by the current in the conductor under element 501 has blocked the passage of a bubble through to the left side of chevron column 503 wherein a bubble is transferred but not replicated.

Likewise, in a transfer-in operation, a bubble is propagated to the left end of chevron column 502. When the bubble propagates toward the apices of the chevrons in column 502, the magnetic field is produced by passing a current through the conductor under element 501. This field blocks passage of the bubble in chevron column 502. Upon rotation of field $H_R$, chevron column 503 becomes magnetically attractive, attracts the bubble from chevron column 502 and propagates the bubble through the associated path comprising elements 504, 510, 511 and so forth.

Some features and designs of switch 500 are described in the aforementioned paper of T. J. Nelson. However, it is noted that in switch 500 of the instant invention, element 506 is disposed substantially parallel to the ends of the respective chevrons of column 503. In addition, element 508 is disposed substantially perpendicular to element 506. Element 507 is disposed intermediate to elements 506 and 508 at a preferred angle which may be determined as a function of the angle described by respective arms of chevrons in the respective chevron columns. Importantly though, it should be noted that the adjacent ends of elements 506, 507 and 508 are substantially co-linear with each other and with element 511 of the propagation paths. Likewise, output elements 504 and 510 have ends thereof which are substantially colinear with the other side of propagation path element 511.

Element 550, shown in dashed outline, may be included in either the input or output configuration. That is, an element such as element 550 may be included in the output portion of switch 500. As an alternative arrangement, in order to provide greater design freedom or modularity, an element such as 550 may be included along with element 509 as well as element 507 wherein essentially an X-shaped element is provided. Utilizing such an X-shaped element (elements 550 and 509 for example) permits closer control of both the input and output paths for the bubble. However, such an X-shaped configuration element is not essential to the operation of switch 500.

Thus, there has been described the process for forming magnetic devices and, in particular, a switch which can be used for replication or transfer of magnetic bubbles from or between propagation paths in a bubble domain system. It is clear that modifications may be made to either the process or the device described herein. However, any modification which falls within the purview of this description is intended to be included herein as well. The described embodiments are intended to be illustrative only and not to be limitative. The limitations of the invention are determined by the scope of the claims appended hereto.

Having thus described a preferred embodiment of the invention, what is claimed is:

1. A method of making a magnetic bubble domain device by
   providing a magnetic film capable of supporting magnetic bubble domains in the presence of properly applied magnetic fields,
   forming a layer of dielectric material on at least one surface of said magnetic film,
   forming a layer of electrically conductive material on said layer of dielectric material,
   applying a first gross definition mask to said layer of electrically conductive material,
   removing portions of said layer of electrically conductive material to expose portions of said layer of dielectric material,
   forming a layer of selectively magnetizable material on said layer of electrically conductive material and the exposed portions of said layer of dielectric material,
   applying a fine definition mask to portions of said layer of magnetizable material,
   removing portions of said magnetizable material in accordance with said fine definition mask,
   applying a second gross definition mask to said layer of magnetizable material, and
   removing additional portions of said layer of magnetizable material in accordance with said second gross definition mask.

2. The method recited in claim 1 including
   applying a second fine definition mask to said layer of magnetizable material and exposed portions of said layer of electrically conductive material, and
   removing selected portions of said layer of magnetizable material and said layer of electrically conductive material in accordance with said second fine definition mask.

3. The method recited in claim 2 wherein said magnetic film comprises
   a magnetic garnet material,
   said layer of electrically conductive material comprises a metal such as aluminum, copper or alloys thereof,
   said magnetizable layer comprises permalloy, and
   said masks comprise photoresist materials.

4. A magnetic bubble domain device comprising a layer of magnetic bubble domain material and a layer of magnetizable material wherein:
   said layer of magnetizable material is formed to comprise;
   at least two columns of chevron shaped elements having the apices of each column substantially colinear and pointing toward each other, at least one propagation path element adjacent one of said columns of chevron shaped elements, a first bar element substantially parallel to a line defined by the apices of the chevron-shaped elements of said columns and adjacent to but spaced from the ends of said one of said columns of chevron shaped elements, a second bar element substantially perpendicular to said first bar element and extending away from said one column, and a third bar element interposed between and angularly disposed relative to each of said first and second bar elements; and, each of said first, second and third bar elements having an end thereof arranged colinearly with each other and in line with said one propagation path element.

5. The device recited in claim 4 including a second propagation path element adjacent the other of said columns of chevron shaped elements wherein said one propagation path element and said second propagation path element form portions of separate propagation paths.

6. The device recited in claim 4 including:

a central bar element formed from said layer of magnetizable material, said central bar element connected to all of the chevron shaped elements in each of said columns of chevron shaped elements.

7. The device recited in claim 6 wherein:

said central bar element is substantially parallel to the ends of said chevron shaped elements and said first bar element.

8. The device recited in claim 4 including:

conductor means disposed under said layer of magnetizable material and arranged to alter the magnetic field in said device in response to a control signal.

9. The device recited in claim 8 including:

a dielectric layer disposed between said layer of magnetizable material and said layer of magnetic bubble domain material such that said conductor means is electrically isolated from one of said layer of magnetizable material and said layer of magnetic bubble domain material.

10. The device recited in claim 5 wherein:

said one propagation path element is comprised of chevron shaped elements, and;

said second propagation path element is comprised of elements having substantially rectilinear configurations such as H-bars, T-bars or I-bars.

* * * * *